US010980127B2

(12) United States Patent
Len et al.

(10) Patent No.: US 10,980,127 B2
(45) Date of Patent: Apr. 13, 2021

(54) METHODS FOR FABRICATING PRINTED CIRCUIT BOARD ASSEMBLIES WITH HIGH DENSITY VIA ARRAY

(71) Applicant: TTM TECHNOLOGIES, INC., St. Louis, MO (US)

(72) Inventors: Michael Len, Skaneateles, NY (US); Chong Mei, Jamesville, NY (US); Michael Lugert, Manlius, NY (US); Raj Kumar, Anaheim, CA (US)

(73) Assignee: TTM Technologies Inc., Santa Ana, CA (US)

( * ) Notice: Subject to any disclaimer, the term of this patent is extended or adjusted under 35 U.S.C. 154(b) by 0 days.

(21) Appl. No.: 16/435,174

(22) Filed: Jun. 7, 2019

(65) Prior Publication Data
US 2020/0288576 A1     Sep. 10, 2020

Related U.S. Application Data

(60) Provisional application No. 62/814,776, filed on Mar. 6, 2019, provisional application No. 62/837,637, filed on Apr. 23, 2019.

(51) Int. Cl.
*H05K 1/00* (2006.01)
*H05K 1/02* (2006.01)
(Continued)

(52) U.S. Cl.
CPC ......... *H05K 3/0047* (2013.01); *H05K 3/0094* (2013.01); *H05K 3/4038* (2013.01); *H05K 3/42* (2013.01)

(58) Field of Classification Search
CPC ... H05K 1/00; H05K 1/02; H05K 1/11; H05K 1/16; H05K 3/46; H01L 21/44;
(Continued)

(56) References Cited

U.S. PATENT DOCUMENTS 6,043,986 A     3/2000  Kondo et al.
6,475,924 B2 *  11/2002 Yamamoto ............ C04B 35/581
                                                174/257

(Continued)

FOREIGN PATENT DOCUMENTS

EP   2 991 461 A1    3/2016
EP   3 386 277 A1    10/2018
EP   3 416 462 A1    12/2018

OTHER PUBLICATIONS

International Search Report and Written Opinion relating to International Application No. PCT/US2019/036074, dated Jan. 7, 2020, 15 pgs.

*Primary Examiner* — Xiaoliang Chen
(74) *Attorney, Agent, or Firm* — Polsinelli PC

(57) ABSTRACT

A method is provided for forming a printed circuit board (PCB) assembly. The method may include drilling a first plurality of vias having a first diameter in a PCB and filling the first plurality of vias to form a first plurality of plated or filled vias. The method may also include drilling a second plurality of vias having a second diameter in the PCB, and filling the second plurality of vias to form a second plurality of plated or filled vias. The first plurality of plated or filled vias is mixed with the second plurality of plated or filled vias such that the spacing between the first plurality of plated or filled vias and the second plurality of plated or filled vias is less than the first diameter and the second diameter.

24 Claims, 14 Drawing Sheets

(51) Int. Cl.

| | | |
|---|---|---|
| *H05K 1/11* | (2006.01) | |
| *H05K 1/16* | (2006.01) | |
| *H05K 3/46* | (2006.01) | |
| *H01L 21/44* | (2006.01) | |
| *H01L 21/56* | (2006.01) | |
| *H01L 21/768* | (2006.01) | |
| *H01L 23/00* | (2006.01) | |
| *H01L 23/34* | (2006.01) | |
| *H01L 23/48* | (2006.01) | |
| *H01L 23/52* | (2006.01) | |
| *H01L 23/373* | (2006.01) | |
| *H01L 23/473* | (2006.01) | |
| *H01L 23/498* | (2006.01) | |
| *H01L 23/538* | (2006.01) | |
| *H05K 3/00* | (2006.01) | |
| *H05K 3/40* | (2006.01) | |
| *H05K 3/42* | (2006.01) | |

(58) Field of Classification Search
CPC ....... H01L 21/56; H01L 21/768; H01L 23/00; H01L 23/34; H01L 23/48; H01L 23/52; H01L 23/373; H01L 23/473; H01L 23/498; H01L 23/538
USPC ....... 174/262, 250, 251, 255, 257, 260, 261, 174/266; 361/818
See application file for complete search history.

(56) References Cited

U.S. PATENT DOCUMENTS

| | | | | |
|---|---|---|---|---|
| 9,679,872 | B1* | 6/2017 | Wu | H01L 24/17 |
| 9,919,472 | B1* | 3/2018 | Cohen | B23K 20/10 |
| 9,996,653 | B1* | 6/2018 | Shen | H01R 13/62994 |
| 10,096,537 | B1* | 10/2018 | Chen | F28D 15/0233 |
| 10,231,325 | B1* | 3/2019 | Chengson | H05K 1/0228 |
| 2003/0047348 | A1* | 3/2003 | Jessep | H01L 23/49838 174/250 |
| 2004/0148766 | A1* | 8/2004 | Noguchi | H05K 3/4655 29/830 |
| 2006/0051948 | A1* | 3/2006 | Kim | C23C 18/1605 438/597 |
| 2006/0060959 | A1* | 3/2006 | Hayashi | H01L 23/49816 257/697 |
| 2006/0072298 | A1* | 4/2006 | Ng | H05K 1/0224 361/818 |
| 2006/0220227 | A1 | 10/2006 | Marro | |
| 2006/0228912 | A1* | 10/2006 | Morlion | H05K 1/0219 439/65 |
| 2006/0232301 | A1* | 10/2006 | Morlion | H05K 1/114 326/126 |
| 2008/0303157 | A1* | 12/2008 | Cheng | H01L 33/641 257/758 |
| 2010/0294552 | A1* | 11/2010 | Kobayashi | H05K 3/325 174/260 |
| 2010/0314778 | A1* | 12/2010 | Murai | H01L 21/6835 257/774 |
| 2010/0326492 | A1* | 12/2010 | Tan | H01L 31/044 136/246 |
| 2012/0045871 | A1* | 2/2012 | Lee | H01L 23/4334 438/127 |
| 2012/0068335 | A1* | 3/2012 | Song | H01L 25/0657 257/737 |
| 2012/0146023 | A1* | 6/2012 | Craft | C30B 25/18 257/51 |
| 2012/0228754 | A1* | 9/2012 | Liu | A61P 3/00 257/676 |
| 2012/0261166 | A1 | 10/2012 | Oh et al. | |
| 2013/0020121 | A1* | 1/2013 | Sharf | H05K 1/0251 174/266 |
| 2013/0020719 | A1* | 1/2013 | Jung | H01L 25/0657 257/774 |
| 2013/0056255 | A1* | 3/2013 | Biddle | H05K 1/0245 174/266 |
| 2013/0143420 | A1* | 6/2013 | Light | H05K 1/115 439/65 |
| 2013/0258595 | A1* | 10/2013 | Tuckerman | H01L 23/445 361/701 |
| 2013/0285256 | A1* | 10/2013 | Fischer | H01L 21/76898 257/774 |
| 2014/0252632 | A1* | 9/2014 | Barth | H01L 25/0657 257/773 |
| 2015/0092373 | A1* | 4/2015 | Chan | H05K 1/112 361/767 |
| 2015/0303173 | A1* | 10/2015 | Maydar | H01L 23/49827 257/664 |
| 2016/0150633 | A1* | 5/2016 | Cartier, Jr. | H05K 1/0222 174/251 |
| 2016/0336047 | A1* | 11/2016 | Benedict | G11C 5/063 |
| 2017/0092565 | A1* | 3/2017 | Chen | F28F 3/12 |
| 2017/0265296 | A1* | 9/2017 | Charbonneau | H05K 3/429 |
| 2018/0061787 | A1* | 3/2018 | Wu | H01L 23/49811 |
| 2018/0070439 | A1* | 3/2018 | Charbonneau | H05K 1/0251 |
| 2018/0078274 | A1* | 3/2018 | Lockard | A61B 10/0266 |
| 2018/0156841 | A1* | 6/2018 | Neely | H01L 25/50 |
| 2018/0164001 | A1* | 6/2018 | Schwartz | F25B 21/00 |
| 2018/0226328 | A1* | 8/2018 | Rodriguez | H01L 24/16 |
| 2019/0021176 | A1* | 1/2019 | Law | H01L 21/76897 |
| 2019/0148323 | A1* | 5/2019 | Gu | H01L 24/19 257/774 |
| 2019/0164944 | A1* | 5/2019 | Chae | H01L 33/62 |
| 2019/0348344 | A1* | 11/2019 | Lu | H01L 23/49579 |

* cited by examiner

METHODS FOR FABRICATING PRINTED CIRCUIT BOARD ASSEMBLIES WITH HIGH DENSITY VIA ARRAY

CROSS-REFERENCE TO RELATED PATENT APPLICATIONS

This patent application claims the benefit under 35 U.S.C. § 119(e) of U.S. Patent Application Ser. No. 62/814,776, entitled "METHODS FOR FABRICATING PRINTED CIRCUIT BOARD ASSEMBLIES WITH HIGH DENSITY VIA ARRAY," filed on Mar. 6, 2019, and claims the benefit under 35 U.S.C. § 119(e) of U.S. Patent Application Ser. No. 62/837,637, entitled "METHODS FOR FABRICATING PRINTED CIRCUIT BOARD ASSEMBLIES WITH HIGH DENSITY VIA ARRAY," filed on Apr. 23, 2019. The contents of each of the above-mentioned patent applications are hereby incorporated by reference in their entireties.

FIELD

The disclosure is directed to methods for forming a high density via array printed circuit board. Specifically, the methods include sequential drilling and plating the printed circuit board.

BACKGROUND

Printed Circuit Board Assemblies (PCBAs) are formed of a Printed Circuit Board (PCB) with Surface Mount Technology (SMT) Components soldered to the surface of the PCB. The SMT Components dissipate power. With integrated circuits (ICs) becoming more power hungry with the trend of miniaturization, thermal management on the PCB becomes a bigger challenge.

The PCB has a thermal conductivity ranging from 0.25 W/mK to 3 W/mK, which results in a high thermal resistance through the PCB and consequently a large temperature variation in the PCB. The thermal conductivity is a material property that measures the ability to conduct heat.

For applications that dissipate significant power, a coin approach may be used. Specifically, copper coins are inserted into a PCB to help conduct the heat away from heat sources, such as IC, die, or components, to a heat sink underneath the PCB. In the coin process, a hole is cut in the PCB and a thermally conductive coin, such as a copper coin, is inserted into the hole. However, the manufacturing of PCBs using copper coins is labor intensive and thus expensive. Usually, the coin approach is used for low volume and high performance PCB assemblies.

A conventional PCB process replaces the copper coins with a plurality of vertical interconnect accesses (vias of PTHs), which can be cost saving. PTHs are typically filled with 1 mil thick copper. However, in the conventional PCB process, via density is limited. The thermal conductivity of the vias is not as good as a copper coins. Often, the vias are not adequate enough to achieve the desired thermal management for the PCBAs.

There still remains a need for developing a cost effective solution to provide the thermal performance similar to a copper coin approach for the PCBAs.

BRIEF SUMMARY

The disclosure provides a printed circuit board (PCB) assembly with high thermal via density and methods for fabricating the PCB assembly.

In an embodiment, a method is provided for forming a printed circuit board (PCB) assembly. The method may include drilling a first plurality of vias having a first diameter in a PCB and may require filling the first plurality of vias to form a first plurality of plated or filled vias. The method shall also include drilling a second plurality of vias having a second diameter in the PCB, and may require filling the second plurality of vias to form a second plurality of plated or filled vias. The first plurality of plated or filled vias is mixed with the second plurality of plated or filled vias such that the spacing between the first plurality of plated or filled vias and the second plurality of plated or filled vias is less than the first diameter and the second diameter, and is closer than current standard PCB fabrication techniques.

In an embodiment, a printed circuit board (PCB) assembly may include a PCB comprising a plurality of layers having a plurality of traces and a plurality of conductive pads. The PCB assembly may also include surface mount technology (SMT) components mounted on a first side of the PCB. The PCB assembly may further include a first plurality of plated or filled vias having a first diameter and a second plurality of plated or filled vias having a second diameter on the PCB, wherein the first plurality of plated or filled vias is mixed with the second plurality of plated or filled vias such that the spacing between the first plurality of plated or filled vias and the second plurality of plated or filled vias is less than the first diameter and the second diameter.

In some embodiments, each of the first plurality of plated or filled vias is surrounded by two or more of the second plurality of plated or filled vias.

In some embodiments, each of the first plurality of vias and the second plurality of vias may include through vias, blind vias, and/or buried vias.

In some embodiments, the method may also include drilling a third plurality of vias having a third diameter in the PCB between the first plurality and second plurality of vias and filling the third plurality of vias to form a third plurality of plated or filled vias.

In some embodiments, the method may also include planarizing the first plurality of plated or filled vias, the second plurality of plated or filled vias, and/or the third plurality of plated or filled vias.

In some embodiments, the spacing between the first plurality of plated or filled vias and the second plurality of plated or filled vias is less than the first diameter, the second diameter, and the third diameter.

In some embodiments, each of the first plurality of plated or filled vias is surrounded by two or more of the second plurality of plated or filled vias and two or more of the third plurality of plated or filled vias.

In some embodiments, the step of filling the first plurality of vias to form a first plurality of plated or filled vias may include plating copper to fill the first plurality of vias in the outer layer or filling the first plurality of vias with a non-conductive filler in the layers of the PCB below the outer layer.

In some embodiments, the method may also include varying the spacing between the first plurality of plated or filled vias and the second plurality of plated or filled vias to adjust a coefficient of thermal expansion (CTE) of the PCB.

In some embodiments, a first filling material fills the first plurality of vias, and a second filling material fills the second plurality of vias.

In some embodiments, the first filling material is different from the second filling material to adjust a coefficient of thermal expansion (CTE) of the PCB.

In some embodiments, each of the first filling material and second filling material is selected from a group consisting of copper, solder, gold, silver, aluminum, and thermally conductive materials.

In some embodiments, the thermally conductive material may include silver (Ag)-filled epoxy.

In some embodiments, each of the first filling material and second filling material includes non-conductive materials. In some embodiments, the non-conductive materials may include polymers, such as epoxy or polyimide among others.

In some embodiments, the first filling material or the second filling material may include one or more of conductive paste, plated solid copper, powder metal, or micro and nano metal particles.

In some embodiments, the first filling material or second filling material may include a non-conductive material.

In some embodiments, the non-conductive materials may include epoxy or polyimide.

In some embodiments, the first plurality of plated or filled vias and the second plurality of plated or filled vias are underneath the SMT components and/or around the SMT components.

In some embodiments, the method may also include routing one or more of the plurality of exterior or exposed traces through the first plurality and second plurality of plated or filled vias to shorten lengths for one or more wire bonds or SMT interconnections.

In some embodiments, the first plurality of plated or filled vias and the second plurality of plated or filled vias and one or more of the plurality of internal or external traces and one or more of the plurality of conductive pads are underneath the SMT components and/or around the SMT components.

In some embodiments, a top surface and a bottom surface of the PCB are coplanar with the remaining surface area. This is a result or benefit of the HDVP approach.

In some embodiments, one or more of the first plurality of plated or filled vias and one or more of the second plurality of plated or filled vias are thermally separated and/or physically separated, but share a common electrical ground.

In some embodiments, the PCB assembly may also include one or more plated or filled vias at discrete locations. For example, the vias may be plated or filled to form a desired pattern. Via patterns can be duplicated in many locations across the PCB without significant cost increase. For example, the via patterns can be arranged near local thermal loading areas to reduce the thermal resistance. This is one of the benefits over the traditional coin method. In contrast, the additional coins at discrete locations can increase the cost significantly.

In some embodiments, the PCB assembly may also include a third plurality of plated or filled vias having a third diameter among the first plurality of plated or filled vias and the second plurality of plated or filled vias.

In some embodiments, the spacing between the first plurality of plated or filled vias and the second plurality of plated or filled vias is less than the first diameter, the second diameter, and the third diameter.

In some embodiments, each of the first plurality of plated or filled vias is surrounded by two or more of the second plurality of plated or filled vias and two or more of the third plurality of plated or filled vias.

In some embodiments, each of the first plurality of plated or filled vias is surrounded by two or more of the second plurality of plated or filled vias.

In some embodiments, the via are configured as stacked blind vias.

In some embodiments, the PCB assembly may include a heat sink mounted on a second side of the PCB.

Additional embodiments and features are set forth in part in the description that follows, and in part will become apparent to those skilled in the art upon examination of the specification, or may be learned by the practice of the embodiments discussed herein. A further understanding of the nature and advantages of certain embodiments may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

This disclosure addresses the limited via density problem with the conventional PCB process. To achieve higher density of vias or via farm or via pattern, the disclosure provides a sequential drilling, plating and optional filling process for the PCB, which includes a first drilling and a plating or filling iteration to form a first plurality of plated through holes (PTHs) or filled vias in the PCB, followed by a second drilling and plating or filling iteration to form a second plurality of PTHs or filled vias in the PCB, and then a third drilling and plating iteration to form a third plurality of PTHs or vias in the PCB. The combined pattern from the first, second, and third plurality of PTHs or filled vias increases the thermal via density. The iterative drilling followed by copper plating can achieve similar thermal performance to a coin approach. The PTHs are often plated with solid copper to achieve higher thermal conductivity than standard PTHs that have a typical 1 mil thick copper wall and are hollow.

Additionally, other materials can be used to fill the vias. Filling materials, such as "via fill," may include conductive materials such as copper, solder, gold, silver, aluminum, thermally conductive materials, and conductive polymers (e.g. conductive epoxies). Filling materials may also include non-conductive materials, such as non-conductive polymers (e.g. non-conductive epoxies).

The via patterns allow routing external or internal traces in the PCB. The thermal expansion coefficient (CTE) of the PCB can be adjusted by varying spacing between the vias and/r varying filling materials.

Figure 1A:
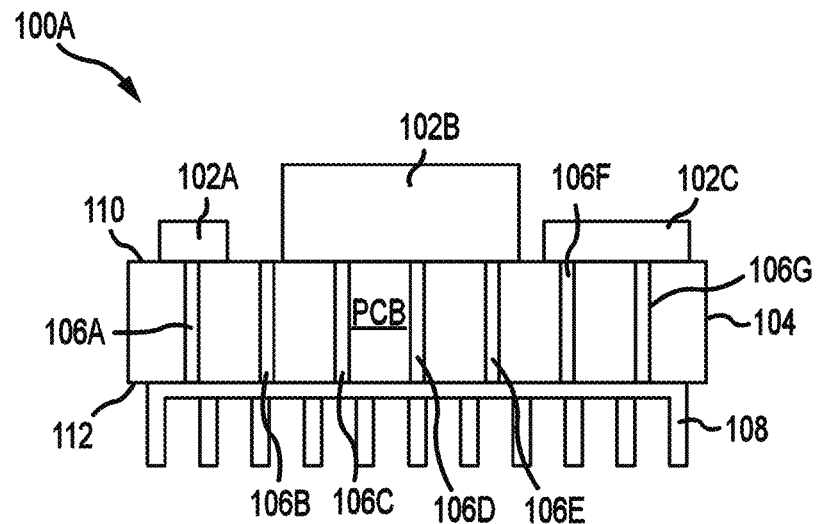
FIG. 1A depicts a side view of a PCB assembly including SMT components and heat sink according to an embodiment.

FIG. 1A depicts a side view of a PCB assembly including SMT components according to an embodiment. As shown, a PCB assembly 100A includes PCB 104, SMT components 102 mounted on the PCB 104, and a heat sink 108 on opposite of the SMT components. The SMT components 102 dissipate power. The primary thermal path for power dissipation is through the multiple vias or PTHs 106A-G drilled in the PCB 104 to a heat sink 108, as shown in FIG. 1A. The vias 106A and 106C-G are under the SMT components 102A-C, while the PTH 106B is between the SMT components 102A and 102B. Note that PTH 106B is shown for illustration purpose only. It will be appreciated by those skilled in the art that there can be multiple vias between the SMT components. Also, it will be appreciated by those skilled in the art that one or more heat sinks may be used in the PCBA.

To reduce the temperature differential through the PCB, the thermal resistance of the PCB may be lowered. One way of lowering the thermal resistance is to add plated through holes (PTHs) or filled vias under and around the SMT components 102A-C. In some embodiments, the vias 106A-G may be filled with copper or other via fill materials. It will be appreciated by those skilled in the art that the number of SMT components may vary.

The vias or PTHs 106A-G are used for making interconnections between the layers and in this role are more usually called vertical interconnect accesses (vias). A via is an electrical connection between layers in an integrated circuit (IC) that goes through one or more adjacent layers. In the PCB 104, each of the vias or PTHs 106A-Q includes two conductive pads in corresponding positions on different layers of the board that are electrically connected by a hole through the board. The hole is made conductive by electroplating. With the vias 106A-G, there is a conductive path from one side 110 of the PCB 104 to the other side 112. It will be appreciated by those skilled in the art that the number of vias may vary.

In some embodiments, the PCB assembly may not include wire bond, such as shown in FIG. 1A.

Figure 1B:
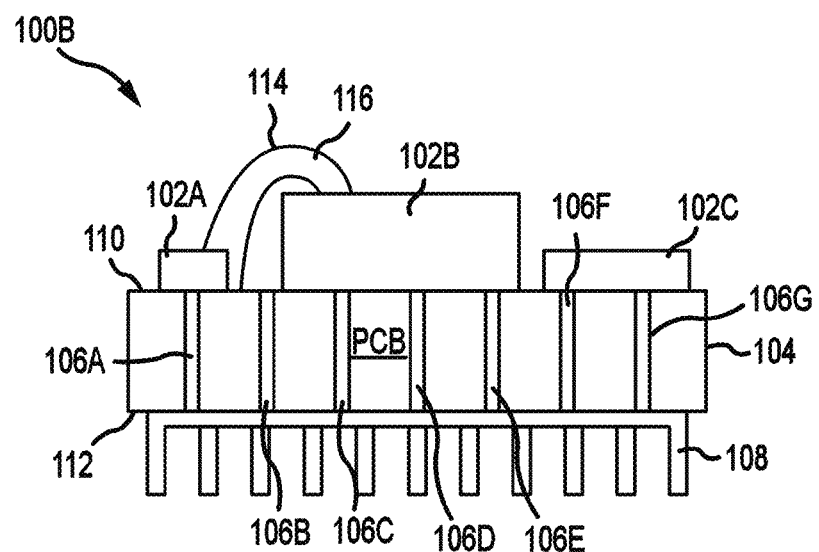
FIG. 1B depicts a side view of a PCB assembly including SMT components with wire bond interconnections and heat sink according to an embodiment.
Figure 1C:
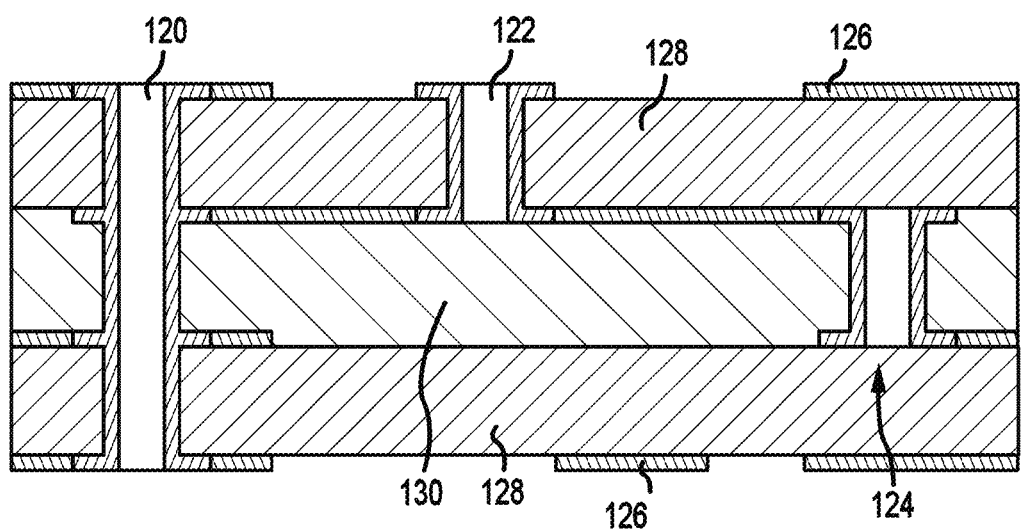
FIG. 1C depicts a side view of a blind via, a buried via, and a through-hole via according to an embodiment.

In some embodiments, the PCB assembly may include wire bond. As shown in FIG. 1B, the PCB assembly 100B may optionally include wire bond 116 from SMT component 102B to PCB 104 and/or wire bond 114 SMT component 102B to SMT component 102A.

In some embodiments, the vias may not be through the entire PCB as shown in FIG. 1A or 1B, but are partially through the PCB. Even though the vias are illustrated as through vias in FIG. 1A or 1B, the vias can also be blind vias 122, or buried vias 124, as shown in FIG. 10. Blind vias 122 are exposed on one side of the PCB including metal layers 126 and non-conducting layers 128 and 130. For example, blind vias can be on the top of the PCB as shown in FIG. 10. Blind vias can also be on the bottom side of the PCB (not shown). Buried vias 124 connect metal internal layers without being exposed on any external surface.

When the vias are placed closer to each other, the vias would have lower thermal resistance. Based on manufacturing design rules, a standard distance between two neighboring drilled holes may be one drill diameter. However, the distance between two neighboring drilled holes may be less than one diameter.

Several issues may limit how close the vias can be spaced apart from each other. The main problem with limited via density is that as the via density increases, the PCB material walls between the vias become thinner and more fragile such that the PCB material walls cannot withstand the remaining PCB processes. After the first drilling to form the first drilled through-hole, the first drilled via holes are plated through holes (PTH) during the first plating process, such that the PCB is supported by the PTH. As such, the PCB is strong enough for sequential drilling and plating as well as the remaining PCB process.

In some embodiments, the spacing between two neighboring vias is less than 1 diameter of the drill hole. In some embodiments, the spacing between two neighboring vias is less than 0.8 diameter of the drill hole. In some embodiments, the spacing between two neighboring vias is less than 0.6 diameter of the drill hole. In some embodiments, the spacing between two neighboring vias is less than 0.4 diameter of the drill hole. In some embodiments, the spacing between two neighboring vias is less than 0.2 diameter of the drill hole. In some embodiments, the spacing between two neighboring vias is less than 0.1 diameter of the drill hole. In some embodiments, the spacing between two neighboring vias is less than 0.05 diameter of the drill hole. In some embodiments, the spacing between two neighboring vias is less than 0.01 diameter of the drill hole. In some embodiments, the spacing between two neighboring vias is less than 0.005 diameter of the drill hole. In some embodiments, the spacing between two neighboring vias is less than 0.001 diameter of the drill hole. In some embodiments, the spacing between two neighboring vias is zero such that the two neighboring vias are touching.

Additionally, when a via hole becomes too large, the via hole cannot be plated to be solid with copper. The diameter of the via hole is equal to or smaller than 25 mil diameter.

Figure 2A:
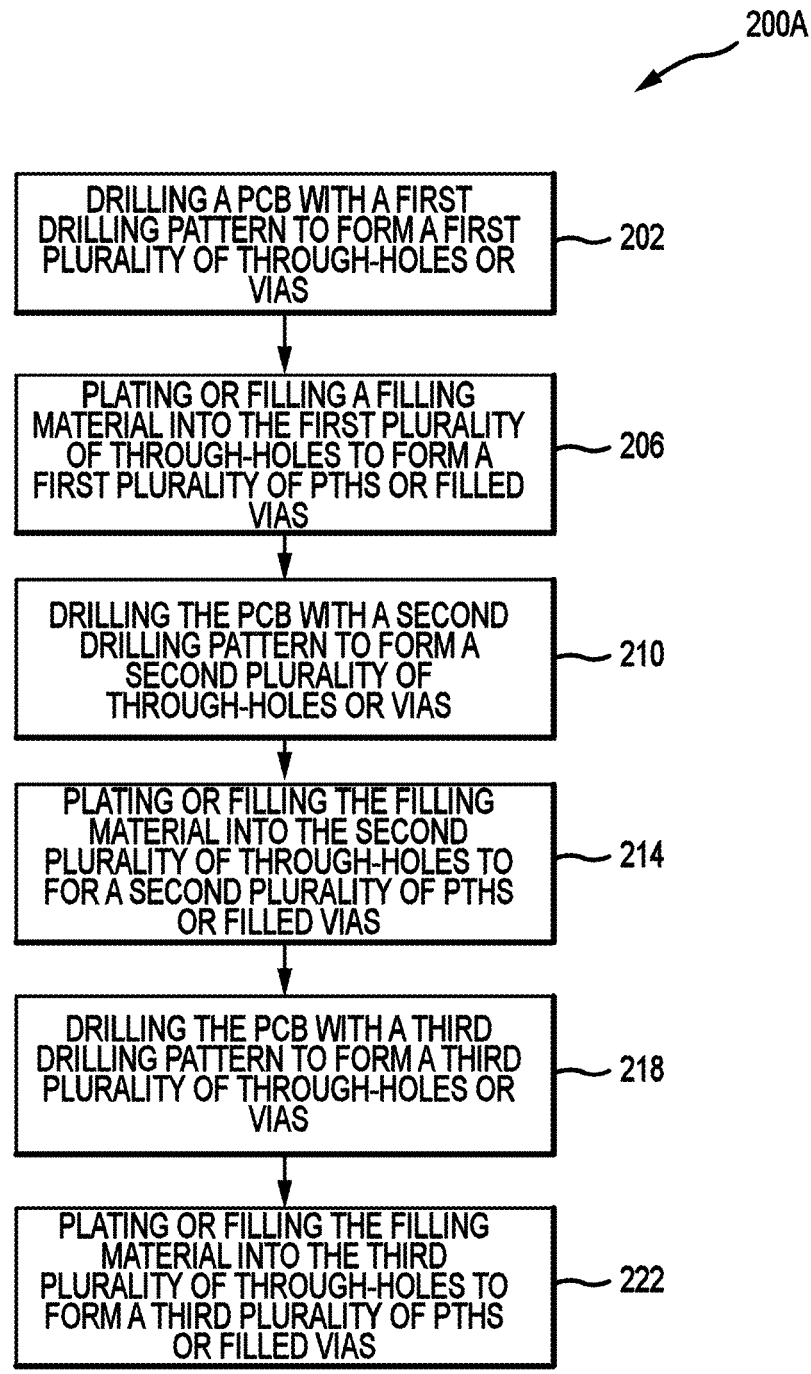
FIG. 2A is a flow charting illustrating the steps for sequential drilling vias and plating or filling the vias in a PCB according to an embodiment.

FIG. 2A is a flow charting illustrating the steps for sequential drilling through-holes or vias and plating the through-holes or filling the vias in a PCB according to an embodiment. As shown, a sequential drilling and plating process 200A includes drilling a PCB with a first drilling pattern to form a first plurality of through-holes or vias at operation 202. A computer-driven machine can use a drilling pattern to identify proper drill spots to bore. An x-ray locator can be used to identify the proper drill spots.

The process 200A also includes plating a filling material into the first plurality of through-holes or vias to form a first plurality of filled vias in the PCB at operation 206. The process 200A also includes drilling the PCB with a second drilling pattern to form a second plurality of through-holes or vias at operation 210. The process 200A also includes plating a filling material the filling material into the second plurality of through-holes to form a second plurality of PTHs or filled vias in the PCB at operation 214. The second drilling pattern is different from the first drilling pattern such that the second drilling pattern fills the space surrounding the first plurality of through-holes or vias. In some embodiments, each of the first plurality of PTHs or filled vias is surrounded by two or more of the second plurality of PTHs or filled vias.

The process 200A may further include drilling the PCB with a third drilling pattern to form a third plurality of through-holes or vias at operation 218. The process 200A may also include plating or filling the filling material into the third plurality of through-holes or vias to form a third plurality of PTHs or filled vias in the PCB at operation 222. The third drilling pattern is different from the first and second drilling patterns such that the third drilling pattern fills the space surrounding the first plurality of PTHs or filled vias and the second plurality of PTHs or filled vias. In some embodiments, each of the first plurality of PTHs or filled vias is surrounded by two or more of the second plurality of PTHs or filled vias and two or more of the third plurality of PTHs or filled vias.

Figure 2B:
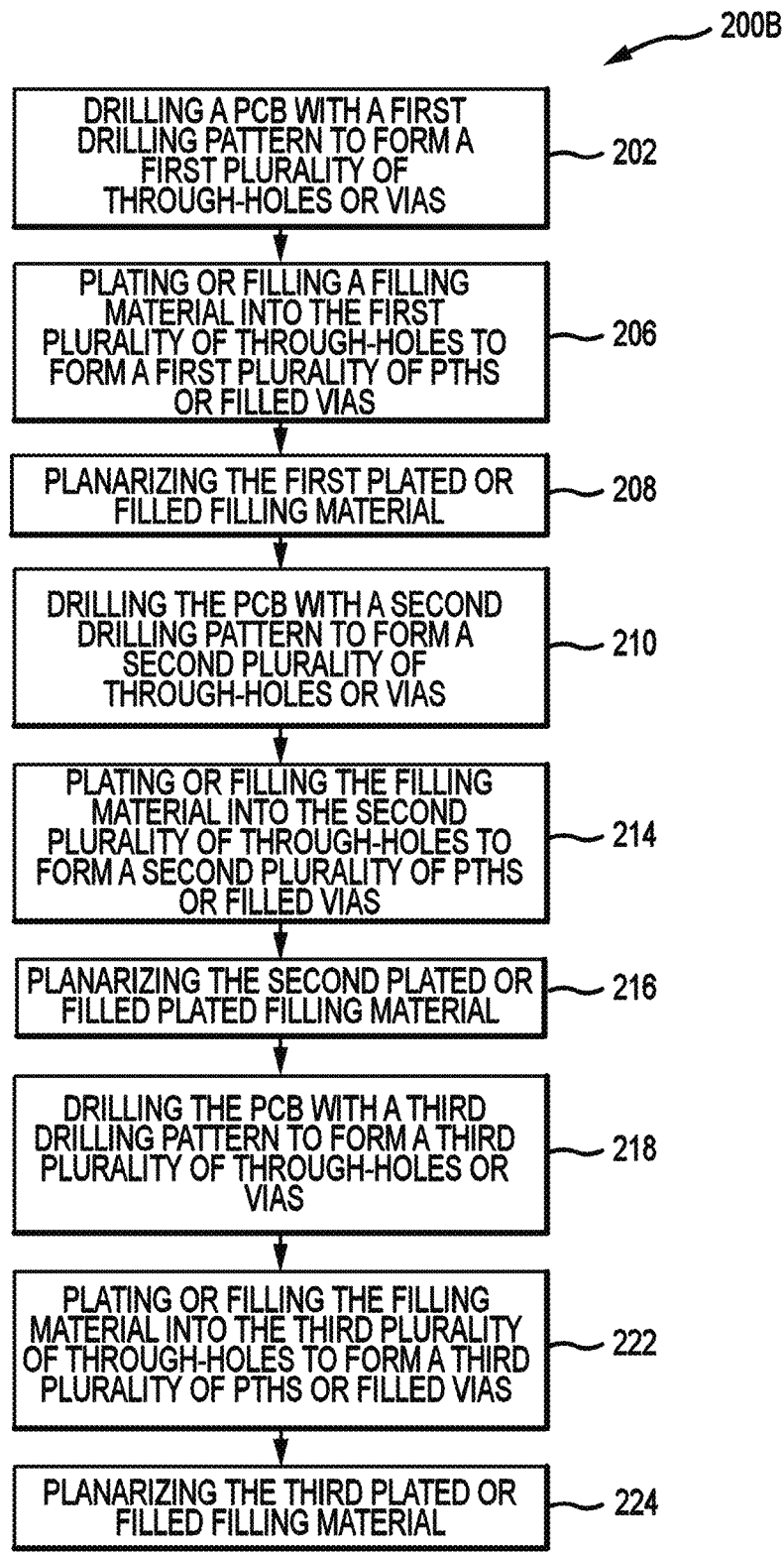
FIG. 2B is a flow charting illustrating the steps for sequential drilling vias, plating or filling the vias, and planarizing in a PCB according to an embodiment.

In some embodiments, the process may optionally include a planarization step following each respective plating step. FIG. 2B is a flow charting illustrating the steps for sequential drilling vias, plating or filling the vias, and planarizing in a PCB according to an embodiment. As shown in FIG. 2B, a method 200B may optionally add steps or operations 208, 216, and 224. Specifically, following the step of plating a filling material into the first plurality of through-holes to form a first plurality of PTHs or vias, the method may optionally include planarizing the first plated filling material at operation 208. Also, following the step of plating a filling material into the second plurality of through-holes to form a second plurality of PTHs or vias, the method may optionally include planarizing the second plated filling material at operation 216. Further, following the step of plating a filling material into the third plurality of through-holes to form a third plurality of PTHs or vias, the method may optionally include planarizing the third plated filling material at operation 224.

In some embodiments, the process may include an optional planarization step following one or more plating steps.

It will be appreciated by those skilled in the art that the process may continue with drilling a fourth drilling pattern, a fifth drilling pattern, a sixth drilling pattern, . . . , a nth drilling pattern to form the respective plurality of through-holes, followed by filling the through holes, for example, by plating a respective filling material into the through-holes.

In some embodiments, the plating is an electroplating.

Example Plated Through-Hole Patterns or Via Patterns

Figure 3A:
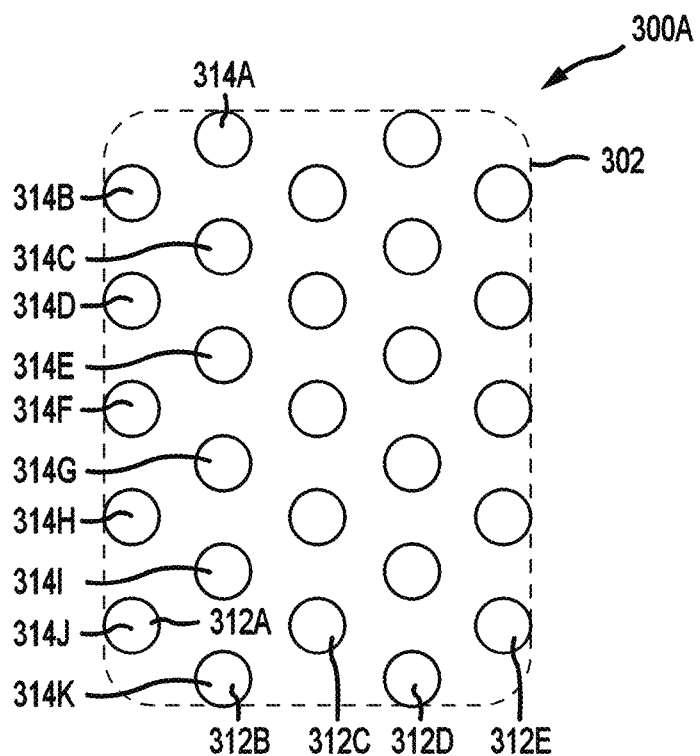
FIG. 3A shows a top view of a first plurality of plated through-holes (PTHs) or filled vias in a PCB according to an embodiment.

FIG. 3A shows a top view of a first plurality of PTHs or filled vias in a PCB according to an embodiment. As shown, a first drilling pattern 300A includes twenty-seven PTHs or filled vias on PCB 302, arranged in five columns 312A-E and eleven rows 314A-K. The vias are spaced apart from each other. Columns 312A, 312C, 312E have the same via configuration including five vias, while columns 312B and 312D have the same via configuration including six vias.

Figure 3B:
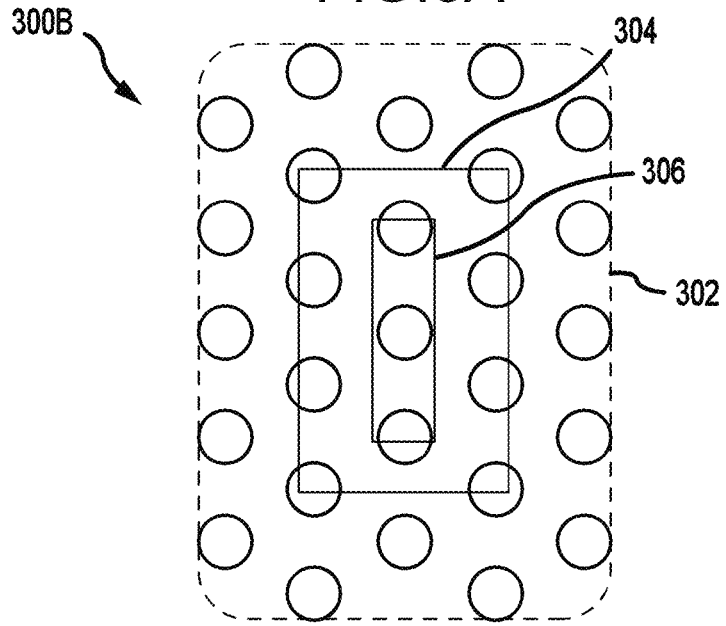
FIG. 3B shows a top view of a first plurality of PTHs or filled vias of FIG. 3A in a PCB including an active area according to an embodiment.

FIG. 3B shows a top view of a first plurality of PTHs or filled vias of FIG. 3A in a PCB including an active area according to an embodiment. A PCB 300B may include the first drilling pattern 300A shown in FIG. 3A, an active area, as well as a SMT component. As shown in FIG. 3B, a PCB may have a contour 302. Within the contour 302, there is a large rectangular contour 304 and a small rectangular contour 306. The large rectangular contour 304 represents a footprint of the SMT component, while the small rectangular contour 306 is the area of heat dissipation within the SMT Component, typically referred to as an active area. As shown in FIG. 3B, some PTHs or filled vias are within the small rectangular contour 306. Some PTHs or filled vias are outside the large contour 304, but within the contour 302 of the PCB.

Figure 4A:
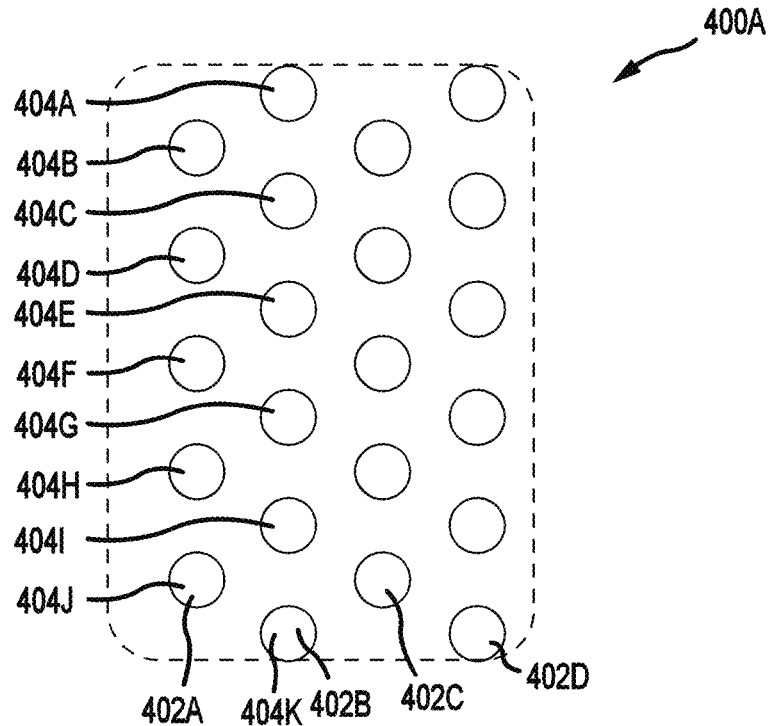
FIG. 4A shows a top view of a second plurality of PTHs or filled vias in a PCB according to an embodiment.

FIG. 4A shows a top view of a second plurality of PTHs or filled vias in a PCB according to an embodiment. As shown, the second drilling pattern 400 includes twenty-two PTHs or filled vias, arranged in four columns 402A-D and eleven rows 404A-K. The vias are spaced apart from each other. Columns 402A and 402C have the same via configuration including five vias, while columns 312B and 312D have the same via configuration including six vias.

Figure 4B:
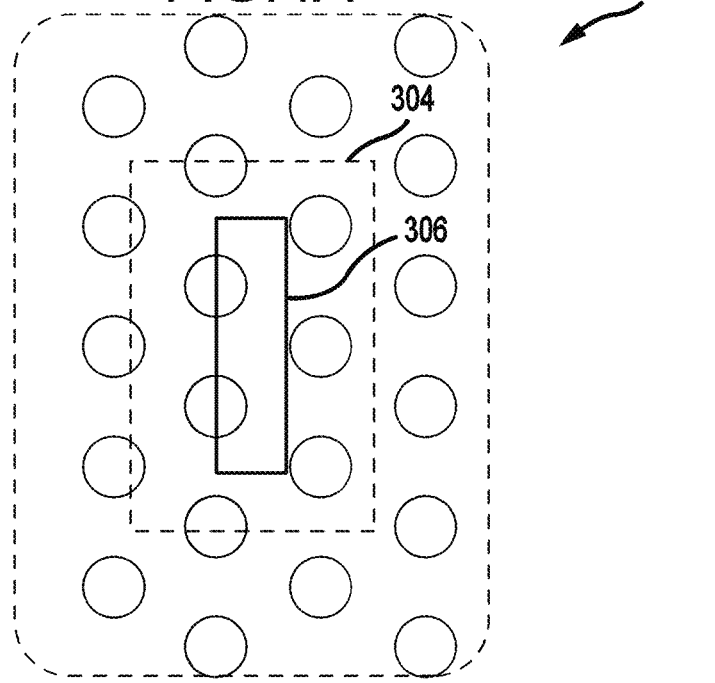
FIG. 4B shows a top view of a second plurality of PTHs or filled vias of FIG. 4A in a PCB including an active area according to an embodiment.

FIG. 4B shows a top view of a second plurality of PTHs or filled vias of FIG. 4A in a PCB including an active area according to an embodiment. A PCB 400B may include the first drilling pattern 400A as shown in FIG. 4A, an active area 306, as well as a SMT component 304. As shown in FIG. 4B, some PTHs or filled vias are within the small rectangular contour 306. Some PTHs or filled vias are outside the large contour 304, but within the contour 302 of the PCB.

Figure 5A:
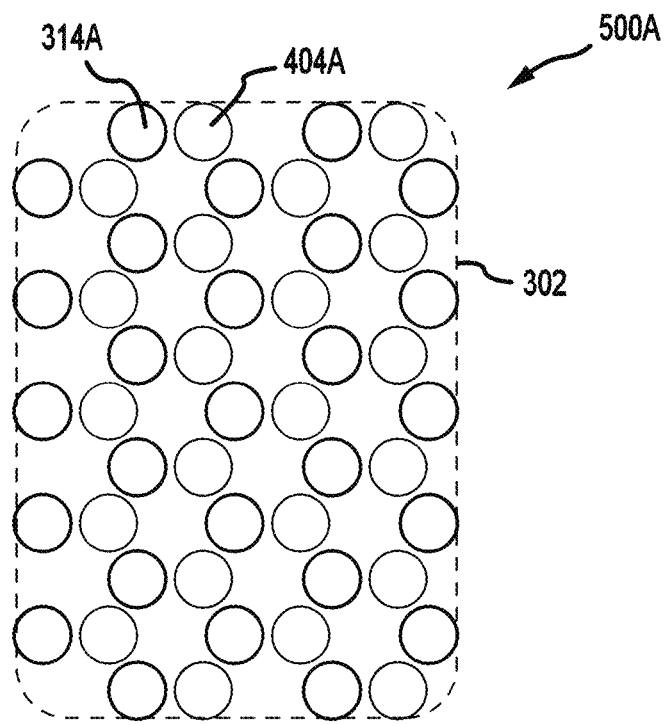
FIG. 5A shows a top view of a first combined plurality of PTHs or filled vias including the first plurality of PTHs or filled vias of FIG. 3A and the second plurality of PTHs or filled vias of FIG. 4A in a PCB according to an embodiment.

FIG. 5A shows a top view of a first combined plurality of PTHs or filled vias including the first plurality of PTHs or filled vias of FIG. 3A and the second plurality of PTHs or filled vias of FIG. 4A in a PCB according to an embodiment. A combined drilling pattern 500A includes forty-nine PTHs from the first drilling pattern 300A including a first plurality of PTHs or filled vias (i.e. twenty-seven PTHs) and the second drilling pattern 400A including a second plurality of PTHs or filled vias (i.e. twenty-two PTHs). As shown, the twenty-seven PTHs from the first drilling pattern are mixed with the twenty-two PTHs from the second drilling pattern, such that each of the first plurality of PTHs or filled vias is surrounded by three of the second plurality of PTHs or vias. The spacing between neighboring for the combined via pattern vias becomes smaller than the first drilling pattern or the second drilling pattern alone. The combined drilling pattern has a higher via density than the first drilling pattern or the second drilling pattern alone.

Figure 5B:
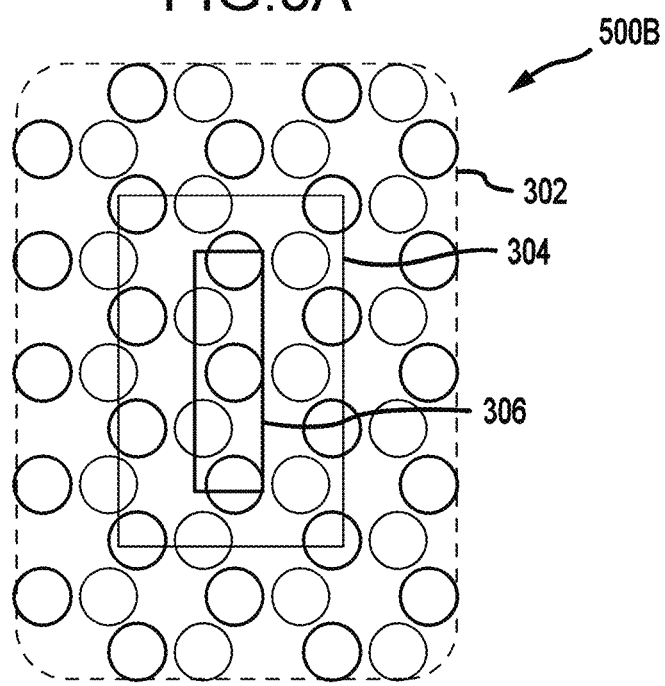
FIG. 5B shows a top view of a first combined plurality of PTHs or filled vias including the first plurality of PTHs or filled vias of FIG. 3A and the second plurality of PTHs or filled vias of FIG. 4A in a PCB including an active area according to an embodiment.

FIG. 5B shows a top view of a first combined plurality of PTHs or filled vias including the first plurality of PTHs or filled vias of FIG. 3A and the second plurality of PTHs or filled vias of FIG. 4A in a PCB including an active area according to an embodiment. As shown in FIG. 5B, a PCB assembly 500B includes SMT component mounted on the PCB 104. The PCB assembly 500B also includes the combined drilling pattern 500A as shown in FIG. 5A, an active area 306, as well as a SMT component 304.

Figure 6A:
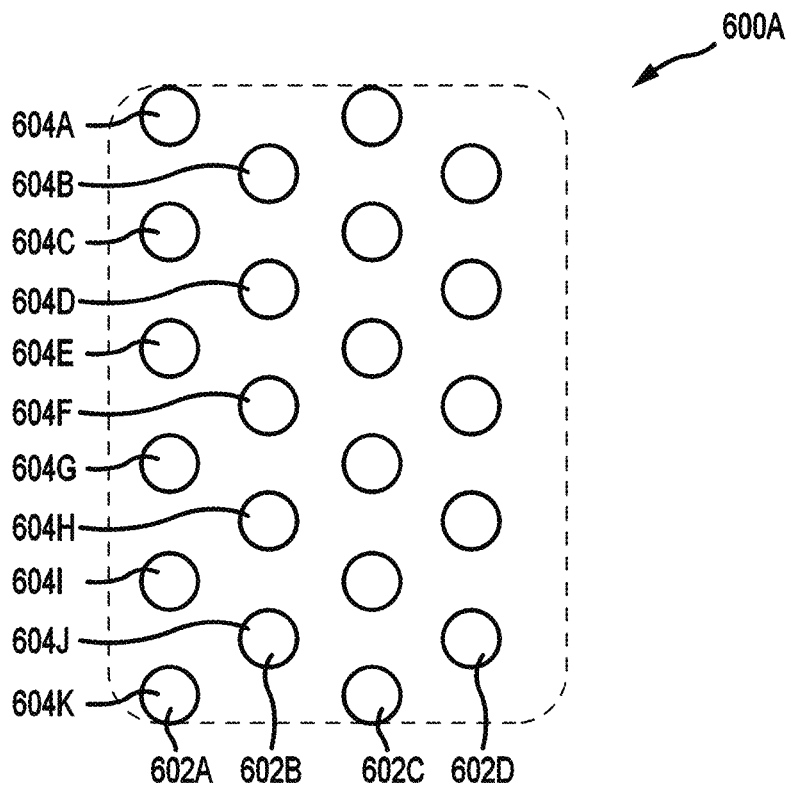
FIG. 6A shows a top view of a third plurality of PTHs or filled vias in a PCB according to an embodiment.

FIG. 6A shows a top view of a third plurality of PTHs or filled vias in a PCB according to an embodiment. As shown, the third drilling pattern 600A includes twenty-two PTHs, arranged in four columns 602A-D and eleven rows 604A-K. The vias are spaced apart from each other. Columns 602A, 602C have the same via configuration including six vias, while columns 602B and 602D have the same via configuration including five vias.

Figure 6B:
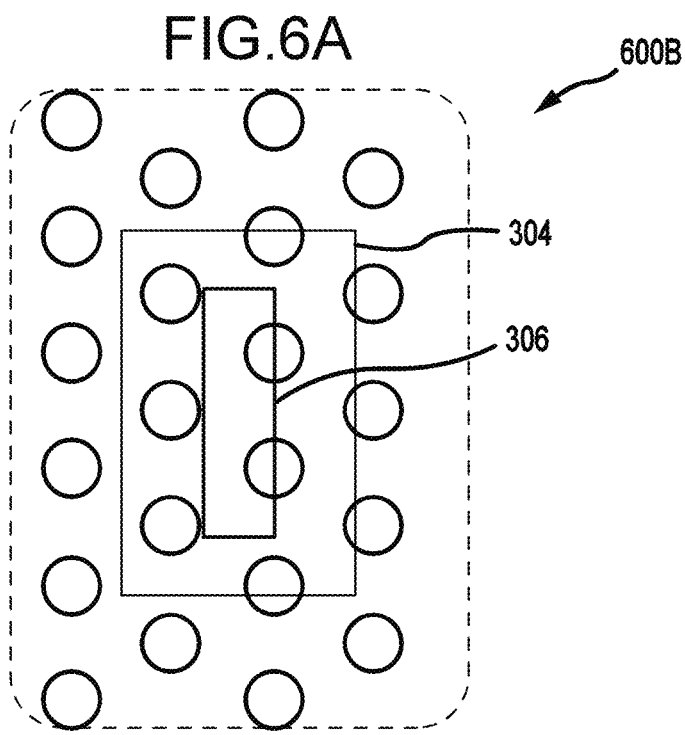
FIG. 6B shows a top view of a third plurality of PTHs or filled vias in a PCB including an active area according to an embodiment.

FIG. 6B shows a top view of a third plurality of PTHs or filled vias in a PCB including an active area according to an embodiment. The PCB assembly 600B also includes the third drilling pattern 600A as shown in FIG. 6A, an active area 306, as well as a SMT component 304.

Figure 7A:
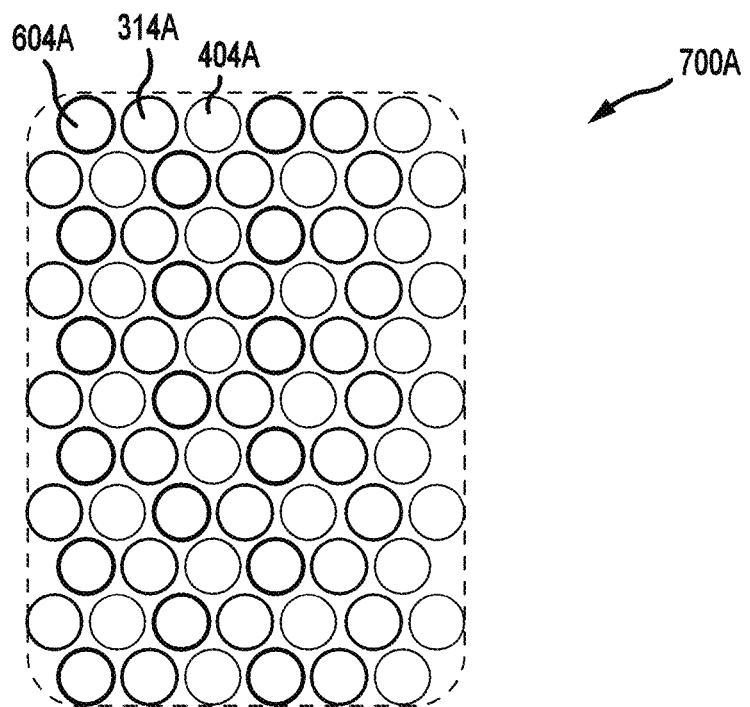
FIG. 7A shows a top view of a second combined plurality of PTHs or filled vias including the third plurality of PTHs or filled vias of FIG. 6A and the first combined plurality of PTHs or filled vias of FIG. 5A in a PCB according to an embodiment.

FIG. 7A shows a top view of a second combined plurality of PTHs or filled vias including the third plurality of PTHs or filled vias of FIG. 6A and the first combined plurality of PTHs or filled vias of FIG. 5A according to an embodiment. The PCB 700A includes a second combined plurality of PTHs or filled vias 700 (i.e. seventy-nine PTHs) from the first combined plurality of PTHs or filled vias 500A and the third drilling pattern including a third plurality of PTHs or filled vias 600A (i.e. twenty-two PTHs). As shown, the first plurality of PTHs or filled vias is mixed with the second plurality of PTHs or filled vias and third plurality of PTHs or filled vias such that each of the first plurality of PTHs or filled vias is surrounded by three of the second plurality of PTHs or filled vias and three of the third plurality of PTHs or vias. The combined drilling pattern has a higher via density than the combined drilling pattern of the first drilling pattern and the second drilling, or the third drilling pattern alone.

Figure 7B:
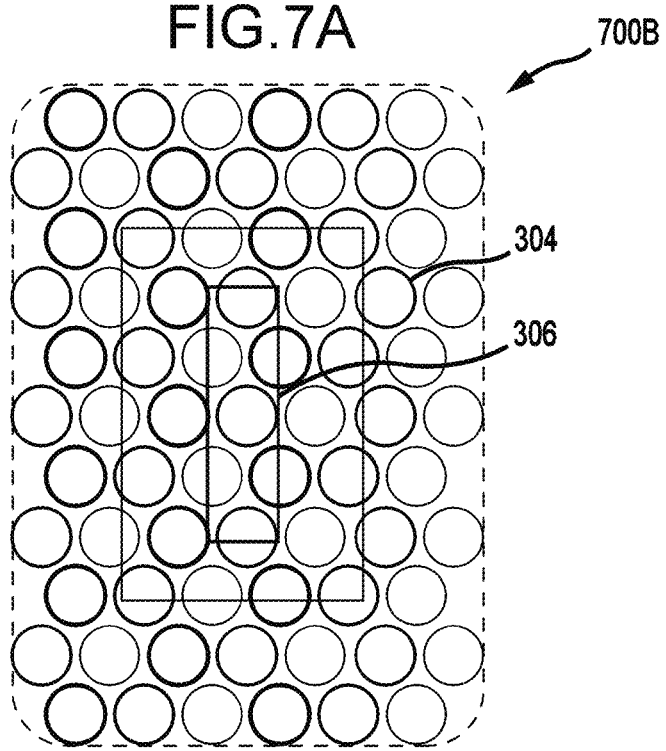
FIG. 7B shows a top view of a second combined plurality of PTHs or filled vias including the third plurality of PTHs or filled vias of FIG. 6A and the first combined plurality of PTHs or filled vias of FIG. 5A in a PCB including an active area according to an embodiment.

FIG. 7B shows a top view of a second combined plurality of PTHs or filled vias including the third plurality of PTHs or filled vias of FIG. 6A and the first combined plurality of PTHs or filled vias of FIG. 5A in a PCB including an active area according to an embodiment. The PCB assembly 700B also includes the combined drilling pattern 700A as shown in FIG. 7A, an active area 306, as well as a SMT component 304.

In some embodiments, the iterations can continue to increase from 3 iterations to a higher number N, which can be 4, 5, 6, 7, 8, 9, 10, or higher among others.

Other sequential drilling, plating, and filling patterns are illustrated below.

Figure 8:
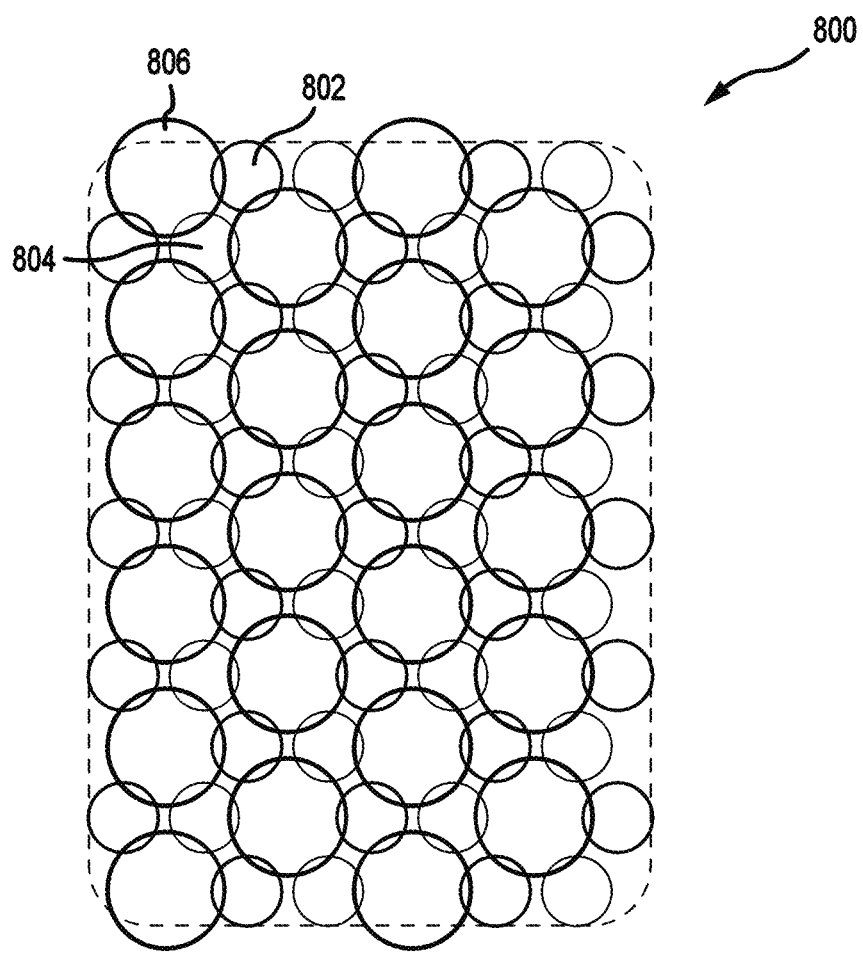
FIG. 8 illustrates a top view of combined via patterns having vias of different sizes in a PCB according to an embodiment.

In some embodiments, each drill iteration can have a different drill diameter, which can be larger or smaller than the previous drill. FIG. 8 illustrates a top view of combined via patterns having vias of different sizes in a PCB according to an embodiment. As shown in FIG. 8, the large vias 806 from a third iteration overlap a portion of the small via 802 from a first iteration and small via 804 from a second iteration. Vias 802 and 804 may have the same size or different sizes. By overlapping the via patterns from different iterations, the via density may be increased.

It will be appreciated by those skilled in the art that the shape and size of the drilling pattern may vary.

In some embodiments, a single lamination, sequential lamination, high density interconnect (HDI) layer build-up, and any other manufacturing processes can be used to form the via structure.

In some embodiments, equivalent thermal resistance to the copper coin inserted by utilizing a conventional PCB/substrate fabrication processes can be achieved with the via patterns without an insertion of secondary coin.

Figure 9:
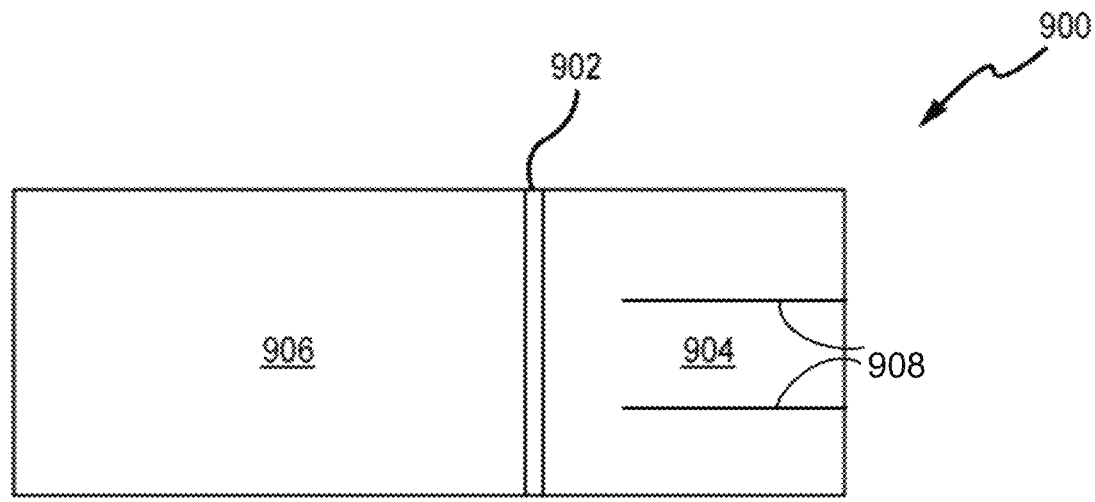
FIG. 9 illustrates a sketch of a PCB fabricated by a traditional coin approach according to an embodiment.

In some embodiments, the top and bottom surfaces of a PCB/substrate are level with the surrounding surface area. This feature is different from the conventional copper coin insert configuration, where at least one of the two surfaces is not coplanar with the remaining surface due to the tolerance stackup variance. FIG. 9 shows a sketch of the PCB formed by using the traditional coin method according an embodiment. As shown, the gap 902 between the PCB 904 and the coin 906. The metal layers 908 do not extend till the gap 902, which, along which with the gap 902, illustrates that the PCB 904 and the coin 906 were not coplanar.

Figure 10A:
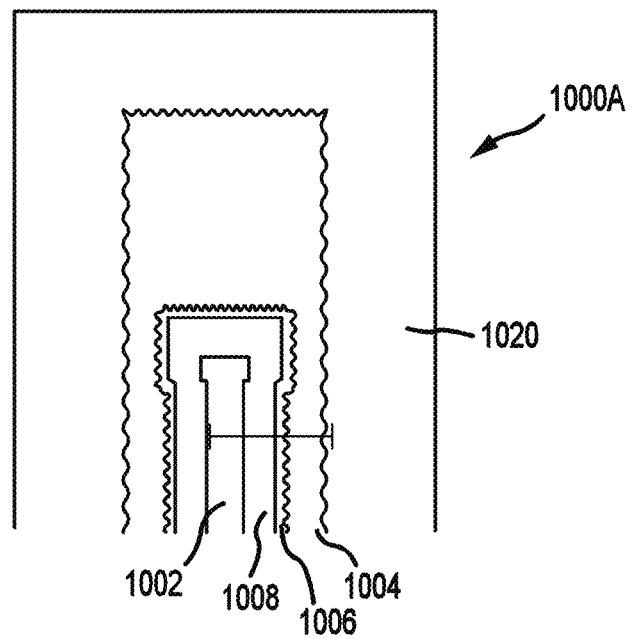
FIG. 10A shows an X-ray image of a PCB including via patterns formed from high density via processing (HDVP) including traces according to an embodiment.

FIG. 10A shows an X-ray image of a PCB including via patterns formed from HDVP including trace according to an embodiment. As shown in FIG. 10A, the X-ray image highlights the unique shapes of the via pattern 1004 (black color). In this example, the via pattern 1004 has a rectangular outer contour. The PCB 1000A includes a circuit board material 1020, the via pattern 1004 located on a center portion of the PCB, a trace 1002 within the via pattern 1004, an insulating layer (e.g. dielectric layer) 1008 (white color) surrounding the trace 1002. The PCB 1000A also includes a thin conductive layer 1006 surrounding the insulating layer 1008 and located between the via pattern 1004 and the insulating layer 1008.

Figure 10B:
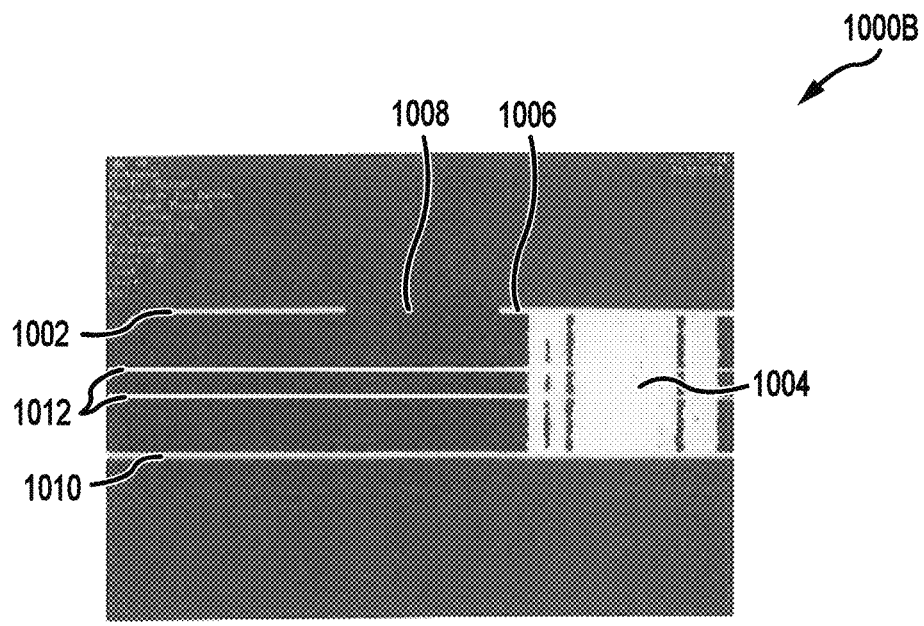
FIG. 10B shows an optical image of the cross-section view of the PCB of FIG. 10A according to an embodiment.

FIG. 10B shows an optical image of the cross-section view of the PCB of FIG. 10A according to an embodiment. The cross-section is illustrated in the X-ray image of FIG. 10A. As shown in FIG. 10B, there is no bright gap between the via pattern on the right side and the PCB on the left side, which indicates that the surface is flat and the via pattern is virtually undetectable. The trace and the via pattern show excellent flatness. Also, trace 1002 (shown as a light line) is routed to the top surface or exterior surface of the PCB (left side) and the via pattern 1004 is between the top surface and the bottom surface 1010 of the PCB (right side). The conductive layer 1006 is also on the top surface with one end connecting to the via pattern 1004 and an opposite end connecting to the insulating layer 1008. The PCB 1000B includes two inner metal layers 1012 (shown as two thin light lines) in the dark background and the bottom 1010 of the PCB 1000B (shown as a light line). The two inner metal layers 1012 extend to the via pattern 1004, which indicates that the via patterns 1004 are coplanar with the PCB.

Figure 10C:
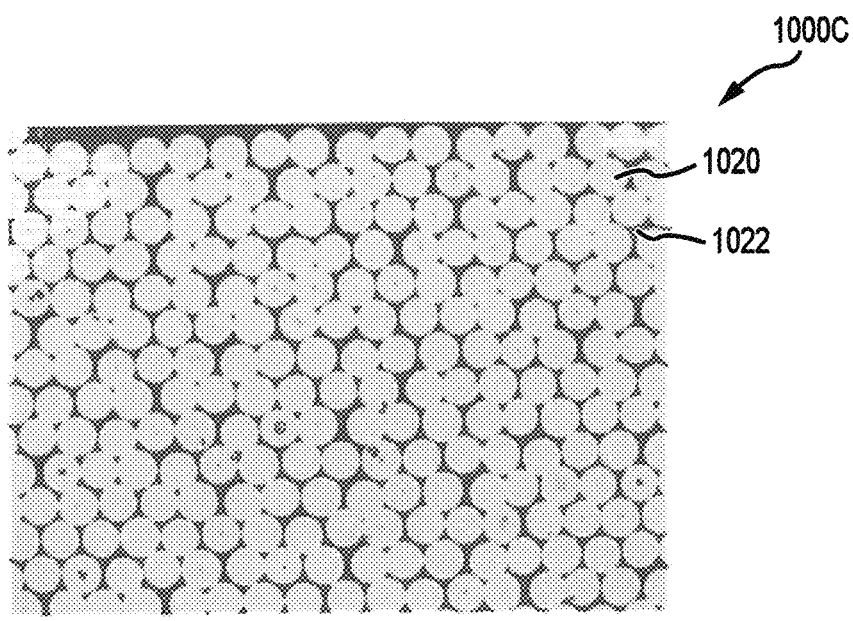
FIG. 10C is an enlarged image of cross-section of the PCB of FIG. 10B according to an embodiment.

FIG. 10C is an image of cross-section of the PCB according to an embodiment. As shown in FIG. 10C, via pattern 1000C do not have any missing vias 1020. In this example, the vias 1020 have small space 1022 in between. The optical image of the cross-section of the via pattern 1000C reveals that the via integrity was solid. No missing vias were observed in any patterns. The via density of approximately 70% was achieved.

In some embodiments, the via density can be up to 100%. In some embodiments, the via density can be up to 95%. In some embodiments, the via density can be up to 90%. In some embodiments, the via density can be up to 85%. In some embodiments, the via density can be up to 80%. In some embodiments, the via density can be up to 75%.

Via Patterns with Flexibility in Shapes and Trace Routing

In some embodiments, traces can be routed through the center of a PCB on inner layers. Traces can be routed through at multiple angles and layers, which is a very valuable feature and cannot be achieved with the traditional copper coin insertion method.

In some embodiments, the method may include routing traces in the via patterns such that the die I/O can have very short distances to solid ground layers.

In some embodiments, the method may also include routing one or more exterior or exposed traces in the PCB to shorten lengths for one or more wire bonds.

In some embodiments, the method may also include placing one or more internal or external traces underneath one or more of the SMT components.

In some embodiments, the method may also include placing one or more conductive pads underneath one or more of the SMT components.

Figure 11A:
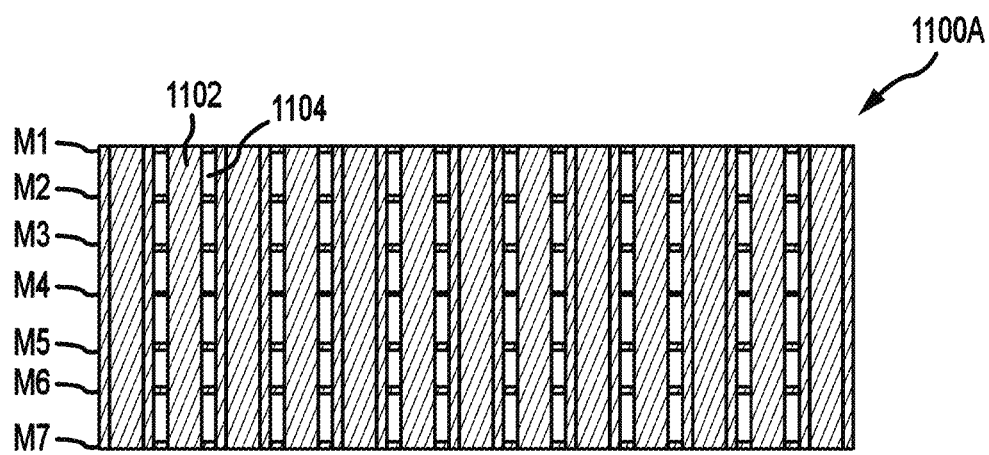
FIG. 11A shows a PCB including via patterns formed from HDVP according to an embodiment.

FIG. 11A shows cross-section of a PCB including a high density via pattern formed from HDVP according to an embodiment. As shown, the PCB 1100A includes seven metal layers M1-M7 and a high density via pattern including a plurality of through vias 1102 between dielectric layers 1104. The through vias 1102 may be filled with conductive materials or non-conductive materials.

Figure 11B:
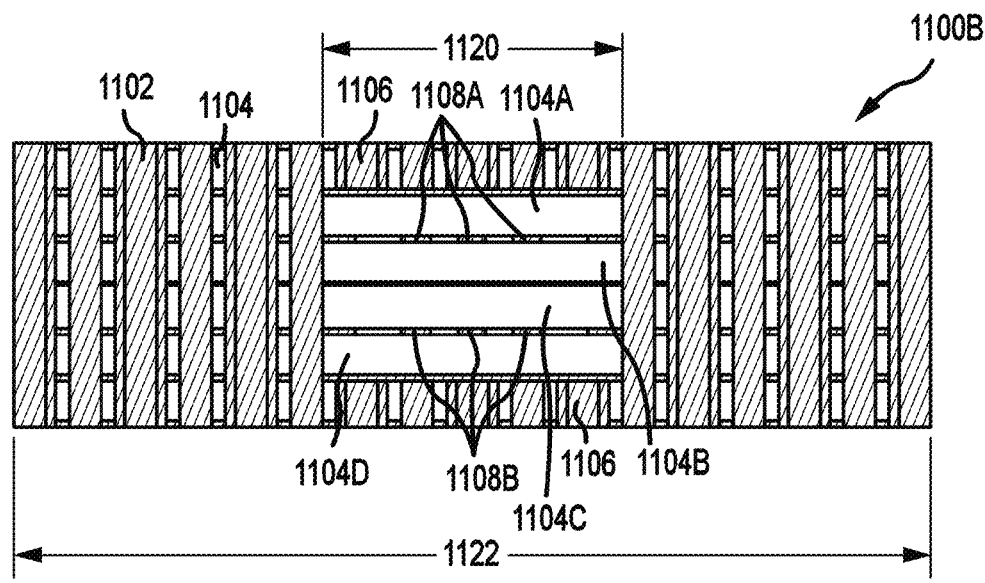
FIG. 11B shows a PCB including via patterns formed from HDVP with buried traces according to an embodiment.

FIG. 11B shows a cross-section of a PCB including a via pattern formed from HDVP and buried traces according to an embodiment. As shown, a PCB 1100B includes seven metal layers M1-M7 and a high density via pattern including a plurality of through vias 1102 between dielectric layers 1104. The through vias 1102 may be filled with conductive materials or non-conductive materials. The PCB 1100B also includes buried traces 1108 between top blind vias 1106 and bottom blind vias 1106. In this example, three buried traces 1108A are between non-conductive layers 1104A and 1104B, and three buried traces 1108B are between non-conductive layers 1104C and 1104D. The PCB 1100B also includes through vias 1102 on the right and left sides of the buried trace/blind via region 1120.

Finite Element Analysis (FEA) Thermal modeling was performed for the PCB including via patterns formed from HDVP with and without buried traces. In the simulation, the buried trace/blind via region 1120 was 25 mils wide, while a total region 1122 including through vias 1102 was 66 mils wide.

The thermal modeling demonstrates that improved thermal performance can be achieved after traces have been routed through the via pattern. Table 1 shows the comparison of PCB including via patterns formed from HDVP without and with buried traces. In the thermal modeling, the dissipated power was 10 W for both the PCB with via patterns and the PCB with via patterns and buried traces, and the heat sink temperature was 85° C. for both the PCB with via patterns and the PCB with via patterns and buried traces. As shown in Table 1, the thermal resistance is 4.2° C./W for the PCB with via patterns and buried traces, which is higher than 1.4° C./W for the thermal resistance for the PCB with via patterns. The top of the PCB has a temperature of 115° C. for the PCB with via patterns, and a temperature of 137° C. for the PCB with via patterns and buried traces. The bottom of the PCB has a temperature of 101° C. for the PCB with via patterns, and a temperature of 95° C. for the PCB with via patterns and buried traces. The temperature delta between the top surface of the PCB and the bottom of the PCB is 42° C. for the PCB with via patterns and buried traces, which is higher than 14° C. for the temperature delta between the top surface of the PCB and the bottom of the PCB for the PCB with via patterns.

In this example, the maximum allowable thermal resistance was about 6° C./W to keep the top temperature of the PCB at 155° C. As such, the thermal resistance for the via pattern with buried traces was 4.2° C./W, which was within the maximum allowable thermal resistance of 6° C./W.

A standard PCB may have a thermal resistance greater than 6° C./W. If there were no vias in the area due to traces, the thermal resistance could be 8° C./W.

TABLE 1

Comparison for PCB including via patterns formed from HDVP without and with buried traces

|  | Via Pattern | Via pattern with Buried Trace |
|---|---|---|
| Dissipated Power (W) | 10 | 10 |
| Heat Sink (° C.) | 85 | 85 |
| PCB Top Temperature (° C.) | 115 | 137 |
| PCB Bottom to Heat Sink Temperature (° C.) | 101 | 95 |
| Temperature Delta between the top and bottom of the PCB (° C.) | 14 | 42 |
| Thermal Resistance (° C./W) | 1.4 | 4.2 |

Figure 12:
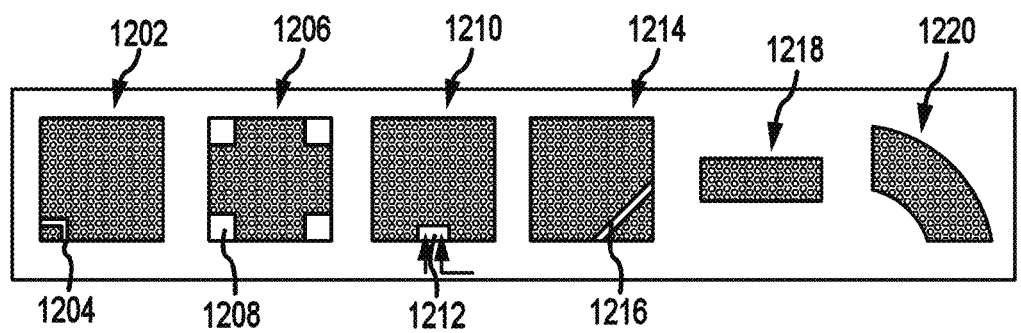
FIG. 12 shows various shaped via patterns and traces in accordance with embodiments of the disclosure.

High density via pattern can be customized for each thermal load. The thermal loads can be physically isolated, distributed as required across a PCB. FIG. 12 shows examples of various shaped via patterns with routed traces in accordance with embodiments of the disclosure. Various via patterns 1202, 1206, 1210, 1214, 1218, and 1220 are provided to demonstrate the layout flexibility of HDVP.

Traces can be routed through at multiple angles and layers. As shown in FIG. 12, a square shaped via pattern 1202 includes a trace 1204 routed at the bottom left corner. The trace 1204 can be an exterior trace as shown. The trace can also be an internal or buried trace (not shown). The trace can have any path including connected straight lines, or curved lines or combination. As another example, a via pattern 1214 is square shaped with a trace 1216 routed at an angle cross the bottom boundary and right boundary of the square. The angled trace 1216 can be an exterior trace (as shown in FIG. 12) or a buried trace (not shown). It will be appreciated by those skilled in the art that the path, length, and angle of the trace may be changed.

The via patterns can allow some portions to be removed to form any irregular shape. For example, as shown in FIG. 12, a via pattern 1206 is square shaped with four corners 1208 removed. It will be appreciated by those skilled in the art that the shape and size of the corners may be changed. As another example, a via pattern 1210 is square shaped with a portion 1212 at the bottom removed. The portion 1212 may be used for ball grid array (BGA) wire bond or SMT connections. The removed portion can be shaped to connect to wires or place other components. It will be appreciated by those skilled in the art that the shape and size of the removed portion may be changed.

The via patterns can have any desired shape, including any irregular shape. For example, a narrow via pattern 1218 has a rectangular shape. The width and the length of the via pattern 1218 may vary. The narrow shaped via patterns can be used to match smaller thermally sensitive dies. As another example, a via pattern 1220 has an arc shape, as shown in FIG. 12.

The HDVP provides many benefits over the traditional coin approach. For example, it is very difficult to use the traditional coin approach for formation of the irregular shapes like the via patterns from HDVP, because the coin is a solid piece.

The disclosure provides very small form factor via pattern, which is much smaller than traditional coins. For example, the via pattern can be small enough to include two or more vias. The via pattern can be sized to be as small as a surface mount capacitor. In contrast, the traditional coin method cannot be sized to be as small as the HDVP.

Also, the traditional coin approach does not allow the exterior traces or buried traces through the via patterns. The ability to route the traces through the via patterns is one of the key design features for customers.

In some embodiments, traces can be added to any layer within the PCB.

In some embodiments, traces may be added from multiple directions.

In some embodiments, traces and conductive pads can be brought to any areas to shorten bond wire length.

In some embodiments, traces can be routed to shorten the distance to ground for radio frequency (RF) and high frequency applications.

In some embodiments, traces can be routed such that the traces and conductive pads are under components.

In some embodiments, the vias can be formed at multiple discrete locations, which may not add to the cost. Also, the vias may be selectively filled to form a desired pattern or the vias may be randomly filled. In contrast, the conventional coin insert method may be more costly when additional coins are needed at multiple discrete locations.

In some embodiments, the vias can be at thermally and physically separated locations and that may be close, while the vias share a common electrical ground. The HDVP allows the via patterns to be physically and thermally separated, but electrically connected, which cannot be achieved by the traditional coin approach.

In some embodiments, the copper plated vias or through holes can be blind vias, buried vias.

In some embodiments, the copper plated vias can be filled vias. The through hole vias or blind vias can be formed by laser drilling or mechanical drilling, among other methods.

Control of Coefficient of Thermal Expansion (CTE)

The HDVP allows for changing CTE more than a standard PCB process. For example, via spacing and filling materials can be utilized to control CTE. In some embodiments, the coefficient of thermal expansion of the PCB (CTE) can be adjusted by varying the via spacing. In some embodiments, the CTE of the PCB can be controlled by using different filling materials in different via patterns.

Figure 13:
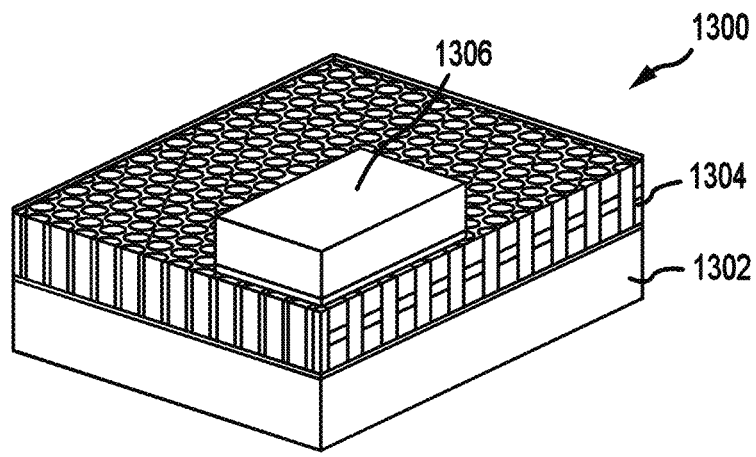
FIG. 13 depicts a PCB assembly including a thermal load and a heat sink according to an embodiment.

A thermal modeling can be performed to estimate CTE for a particular thermal loading condition. FIG. 13 depicts a PCB assembly including a thermal load and a heat sink according to an embodiment. The PCB assembly 1300 includes a PCB 1304, a thermal load 1306 on the top of the PCB 1304, and a heat sink 1302 at the bottom of the PCB 1304. As shown, the thermal load 1306 was applied at a top corner of the PCB assembly 1300.

In this example, assuming that a thermal load of 20 watt (W) was applied with an approximate 100° C. delta temperature between the heat sink 1302 and thermal load component 1306, and a quarter-symmetry was used, and a temperature boundary condition applied to the heat sink 1302 at the bottom of the PCB 1304. The CTE was calculated based upon displacement of the PCB under the thermal load using finite element analysis (FEA) simulations. The PCB material included glass-reinforced epoxy (FR4) and polytetrafluoroethylene (PTFE) mixed with ceramic powder. Table 2 lists the calculated CTE versus various PCB and filling materials based upon the FEA simulations.

TABLE 2

Estimated CTE for various PCB materials and filling materials

| Samples | CTE (x/y) ppm/° C. | CTE (z) ppm/° C. |
| --- | --- | --- |
| 1 Cu | 17 | 17 |
| 2 FR4 | 12 | 55 |
| 3 PTFE mixed with ceramic powder | 17 | 25 |
| 4 FR4 PCB w/Standard PTH | 11.2 | 31.5 |
| 5 FR4 PCB w/HDTVP solid Cu filled vias | 14.3 | 20.0 |
| 6 FR4 PCB w/HDTVP low CTE filled vias | 11.9 | 14.0 |
| 7 FR4 PCB w/spread out HDTVP solid Cu filled vias | 12.2 | 29.8 |

As shown in Table 2, the CTE (x/y) was in the plane of the PCB, while CTE (z) is in the z axis, which was perpendicular to the PCB. Samples 1-3 were Cu, FR4, PTFE mixed with ceramic powder, respectively, without any filling materials. As shown, the PTFE had a CTE (z) of 25 ppm/° C., which was significantly lower than 55 ppm/° C. for FR4, but the PTFE had a CTE(x/y) of 17 ppm/° C. which was slightly higher than 12 ppm/° C. for FR4.

Sample 4 was FR4 PCB with standard PTH. Samples 5-6 were FR4 PCB with via patterns formed from high density through via processing (HDTVP) and having solid filled vias and low CTE filled vias, respectively. Sample 7 was FR4 PCB with spread out via patterns formed from HDTVP and having solid Cu filled vias.

Turn to the CTE(x/y) now, Sample 5 had a CTE of 14.3 ppm/° C., which was larger CTE than 12.2 ppm/° C. for Sample 7. The difference was due to that Sample 7 had a spread out via patterns formed from HDTVP with a lower via density than Sample 5. This demonstrates that the CTE (x/y) can be adjusted by controlling the HDTVP density.

Sample 6 had a CTE (x/y) of 11.9 ppm/° C., which was lower than 14.3 ppm/° C. for Sample 5. This demonstrates that varying the filling material with low CTE to solid copper (Cu) would vary the CTE (x/y).

Turn to the CTE (z) now, the CTE (z) was 14 ppm/° C. for Sample 5 with filler materials having low CTE, which was lower than 20 ppm/° C. for Sample 5. This demonstrates that the filling material has an impact on the CTE. A low CTE (z) may be obtained by using a low CTE filling material.

The CTE (z) was 29.8 ppm/° C. for Sample 7 with the spread out via pattern and solid Cu filled vias, which was higher than Sample 5 with the same solid Cu filled vias but with HDTVP. This demonstrates that when HDTVP is applied to the PCB, the CTE (z) can be increased compared to standard PTH or spread out via patterns.

Filling Materials

In some embodiments, the vias can be first filled. Then, the exterior layers of the PCB can be plated using a standard plating process.

In some embodiments, the plated through hole vias can be a solid plated copper fill.

In some embodiments, heavy copper plating and via fill may be used. The plated through hole vias or filled vias can be a combination of solid plated copper fill and via fill.

In some embodiments, standard copper plating and via fill may be used.

In some embodiments, the via fill can be thermally conductive or electrically conductive via fill, including copper (Cu), silver (Ag), among other equivalent materials with similar properties, which may be blended in with epoxy, polyimide, among other available carriers.

In some embodiments, the via fill may include conductive paste, which can be dispensed into the vias.

In some embodiments, the via fill can include powder metal. In some embodiments, the powder metal can be sintered by using laser.

In some embodiments, the via fill can include micro-particles, or nano-particles.

In some embodiments, the via fill can be an epoxy via fill.

In some embodiments, the via fill can be 3D printed.

In some embodiments, the filling material is solid copper. Electroplated copper has a thermal conductivity of more than 250 W/mK, e.g. pure copper, has a thermal conductivity of 390 W/mk.

In some embodiments, alternative filling materials may be used to fill the PTHs or vias. The alternative filling materials, such as but not limited to solder, gold, silver, aluminum, CVD thermally conductive materials, non-conductive materials (e.g. non-conductive epoxy), combinations thereof, or any other suitable material having thermal conductivities ranging from 0.01 W/mK to greater than 1400 W/mK. For example, a non-conductive via fill material may have a low thermal conductivity, such as 0.25 W/mK. Conductive pastes have a relatively high thermal conductivity ranging from 3.5 to 15 W/mK.

In some embodiments, each of the first filling material in the first plurality of plated or filled vias and the second filling material in the second plurality of plated or filled vias has a thermal conductivity ranging from 0.01 W/mk to 1400 W/mk. In some embodiments, the filling material has a thermal conductivity of at least 0.01 W/mK. In some embodiments, the filling material has a thermal conductivity of at least 5 W/mK. In some embodiments, the filling material has a thermal conductivity of at least 10 W/mK. In some embodiments, the filling material has a thermal conductivity of at least 20 W/mK. In some embodiments, the filling material has a thermal conductivity of at least 30 W/mK. In some embodiments, the filling material has a thermal conductivity of at least 40 W/mK. In some embodiments, the filling material has a thermal conductivity of at least 50 W/mK. In some embodiments, the filling material has a thermal conductivity of at least 60 W/mK. In some embodiments, the filling material has a thermal conductivity of at least 70 W/mK. In some embodiments, the filling material has a thermal conductivity of at least 80 W/mK. In some embodiments, the filling material has a thermal conductivity of at least 90 W/mK. In some embodiments, the filling material has a thermal conductivity of at least 100 W/mK. In some embodiments, the filling material has a thermal conductivity of at least 150 W/mK. In some embodiments, the filling material has a thermal conductivity of at least 200 W/mK. In some embodiments, the filling material has a thermal conductivity of at least 250 W/mK. In some embodiments, the filling material has a thermal conductivity of at least 300 W/mK. In some embodiments, the filling material has a thermal conductivity of at least 350 W/mK. In some embodiments, the filling material has a thermal conductivity of at least 400 W/mK. In some embodiments, the filling material has a thermal conductivity of at least 450 W/mK. In some embodiments, the filling material has a thermal conductivity of at least 500 W/mK. In some embodiments, the filling material has a thermal conductivity of at least 600 W/mK. In some embodiments, the filling material has a thermal conductivity of at least 700 W/mK. In some embodiments, the filling material has a thermal conductivity of at least 800 W/mK. In some embodiments, the filling material has a thermal conductivity of at least 900 W/mK. In some embodiments, the filling material has a thermal conductivity of at least 1000 W/mK. In some embodiments, the filling material has a thermal conductivity of at least 1100 W/mK. In some embodiments, the filling material has a thermal conductivity of at least 1200 W/mK. In some embodiments, the filling material has a thermal conductivity of at least 1300 W/mK.

In some embodiments, the filling material has a thermal conductivity equal to or less than 1400 W/mK. In some embodiments, the filling material has a thermal conductivity equal to or less than 1300 W/mK. In some embodiments, the filling material has a thermal conductivity equal to or less than 1200 W/mK. In some embodiments, the filling material has a thermal conductivity equal to or less than 1100 W/mK. In some embodiments, the filling material has a thermal conductivity equal to or less than 1000 W/mK. In some embodiments, the filling material has a thermal conductivity equal to or less than 900 W/mK. In some embodiments, the filling material has a thermal conductivity equal to or less than 800 W/mK. In some embodiments, the filling material has a thermal conductivity equal to or less than 700 W/mK. In some embodiments, the filling material has a thermal conductivity equal to or less than 600 W/mK. In some embodiments, the filling material has a thermal conductivity equal to or less than 500 W/mK. In some embodiments, the filling material has a thermal conductivity equal to or less than 400 W/mK. In some embodiments, the filling material has a thermal conductivity equal to or less than 300 W/mK. In some embodiments, the filling material has a thermal conductivity equal to or less than 200 W/mK. In some embodiments, the filling material has a thermal conductivity equal to or less than 100 W/mK. In some embodiments, the filling material has a thermal conductivity equal to or less than 50 W/mK. In some embodiments, the filling material has a thermal conductivity equal to or less than 10 W/mK. In some embodiments, the filling material has a thermal conductivity equal to or less than 5 W/mK. In some embodiments, the filling material has a thermal conductivity equal to or less than 1 W/mK.

In some embodiments, the high density via processing (HDVP) can be used to achieve very small areas of thermal improvement. The components can be much smaller than the components using the traditional coin approaches.

In some embodiments, the via fills can be designed to stop leakage at very high frequencies. In some embodiments, the via fills can be alternated to form a large diameter ground ring.

In some embodiments, the via patterns formed from the HDVP can be used to stop moding when standard via spacing does not work at high frequency. The via patterns may also be used for electromagnetic shielding.

In some embodiments, the shapes of ground plane can be customized into shapes as desired. Outer ring diameter can be controlled to create desired via electrical impedance.

By using multiple drilling patterns on the PCB and sequential drilling and plating iterations, the via density on the PCB is significantly increased. When the via density increases, the overall cross-section area for the vias increases, such that the thermal resistance of the PCB is reduced.

Having described several embodiments, it will be recognized by those skilled in the art that various modifications, alternative constructions, and equivalents may be used without departing from the spirit of the disclosure. Additionally, a number of well-known processes and elements have not been described in order to avoid unnecessarily obscuring the embodiments disclosed herein. Accordingly, the above description should not be taken as limiting the scope of the document.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed:

1. A method for forming a printed circuit board (PCB) assembly, the method comprising:
   drilling a first plurality of vias having a first diameter in a PCB;
   filling the first plurality of vias to form a first plurality of plated or filled vias;
   drilling a second plurality of vias having a second diameter in the PCB;
   filling the second plurality of vias to form a second plurality of plated or filled vias;
   drilling a third plurality of vias having a third diameter in the PCB between the first plurality and second plurality of vias; and
   filling the third plurality of vias to form a third plurality of plated or filled vias, wherein the first plurality of plated or filled vias is mixed with the second plurality of plated or filled vias such that the spacing between the first plurality of plated or filled vias and the second plurality of plated or filled vias is less than the first diameter and the second diameter.

2. The method of claim 1, further comprising planarizing the first plurality of plated or filled vias and/or the second plurality of plated or filled vias.

3. The method of claim 1, further comprising planarizing the third plurality of plated or filled vias.

4. The method of claim 1, wherein the spacing between the first plurality of plated or filled vias and the second plurality of plated or filled vias is less than the first diameter, the second diameter, and the third diameter.

5. The method of claim 1, wherein each of the first plurality of plated or filled vias is surrounded by two or more of the second plurality of plated or filled vias and two or more of the third plurality of plated or filled vias.

6. The method of claim 1, further comprising routing one or more exterior or exposed traces in the PCB through the first plurality and the second plurality of plated or filled vias to shorten lengths for one or more wire bonds or SMT connections.

7. The method of claim 1, further comprising placing one or more buried traces underneath one or more of surface mount technology (SMT) components.

8. The method of claim 1, further comprising placing one or more conductive pads underneath one or more of surface mount technology (SMT) components.

9. The method of claim 1, wherein each of the first plurality of vias and the second plurality of vias comprise through via, blind vias, and/or buried vias.

10. The method of claim 1, further comprising varying the spacing between the first plurality of plated or filled vias and the second plurality of plated or filled vias to adjust a coefficient of thermal expansion (CTE) of the PCB.

11. The method of claim 1, the step of filling the first plurality of vias to form a first plurality of plated or filled vias comprises plating copper to fill the first plurality of vias in the outer layer or filling the first plurality of vias with a filling material in the layers of the PCB below the outer layer.

12. The method of claim 1, wherein a first filling material fills the first plurality of vias, and a second filling material fills the second plurality of vias.

13. The method of claim 12, wherein the first filling material is different from the second filling material to adjust a coefficient of thermal expansion (CTE) of the PCB.

14. The method of claim 12, wherein each of the first filling material in the first plurality of plated or filled vias and the second filling material in the second plurality of plated or filled vias has a thermal conductivity ranging from 0.01 W/mK to 1400 W/mK.

15. The method of claim 12, wherein the first filling material or second filling material is selected from a group consisting of copper, solder, gold, silver, aluminum, and thermally conductive materials.

16. The method of claim 12, wherein the first filling material or the second filling material comprises one or more of conductive paste, plated solid copper, powder metal, micro metal particles, or nano metal particles.

17. The method of claim 12, wherein the first filling material or second filling material comprises a non-conductive material.

18. The method of claim 17, wherein the non-conductive materials comprise epoxy or polyimide.

19. The method of claim 1, wherein each of the first plurality of plated or filled vias is surrounded by two or more of the second plurality of plated or filled vias.

20. The method of claim 1, wherein the first plurality of plated or filled vias and the second plurality of plated or filled vias are underneath SMT components and/or around the SMT components.

21. The method of claim 1, further comprising forming one or more plated or filled vias at discrete locations.

22. A method for forming a printed circuit board (PCB) assembly, the method comprising:
   drilling a first plurality of vias having a first diameter in a PCB;
   filling the first plurality of vias to form a first plurality of plated or filled vias;
   drilling a second plurality of vias having a second diameter in the PCB;
   filling the second plurality of vias to form a second plurality of plated or filled vias;
   routing one or more exterior or exposed traces in the PCB through the first plurality and the second plurality of plated or filled vias to shorten lengths for one or more wire bonds or SMT connections; and, wherein the first plurality of plated or filled vias is mixed with the second plurality of plated or filled vias such that the spacing between the first plurality of plated or filled vias and the second plurality of plated or filled vias is less than the first diameter and the second diameter.

23. A method for forming a printed circuit board (PCB) assembly, the method comprising:
   drilling a first plurality of vias having a first diameter in a PCB;
   filling the first plurality of vias to form a first plurality of plated or filled vias;
   drilling a second plurality of vias having a second diameter in the PCB;
   filling the second plurality of vias to form a second plurality of plated or filled vias;
   varying the spacing between the first plurality of plated or filled vias and the second plurality of plated or filled vias to adjust a coefficient of thermal expansion (CTE) of the PCB; and,
   wherein the first plurality of plated or filled vias is mixed with the second plurality of plated or filled vias such that the spacing between the first plurality of plated or filled vias and the second plurality of plated or filled vias is less than the first diameter and the second diameter.

24. A method for forming a printed circuit board (PCB) assembly, the method comprising:
   drilling a first plurality of vias having a first diameter in a PCB;
   filling the first plurality of vias to form a first plurality of plated or filled vias;
   drilling a second plurality of vias having a second diameter in the PCB;
   filling the second plurality of vias to form a second plurality of plated or filled vias;
   wherein a first filling material fills the first plurality of vias, and a second filling material fills the second plurality of vias;
   wherein the first plurality of plated or filled vias is mixed with the second plurality of plated or filled vias such that the spacing between the first plurality of plated or filled vias and the second plurality of plated or filled vias is less than the first diameter and the second diameter.

* * * * *